United States Patent [19]

Varadi

[11] 4,120,047
[45] Oct. 10, 1978

[54] QUASI-STATIC MOS MEMORY ARRAY WITH STANDBY OPERATION

[75] Inventor: Andrew G. Varadi, Saratoga, Calif.

[73] Assignee: National Semiconductor Corporation, Santa Clara, Calif.

[21] Appl. No.: 789,175

[22] Filed: Apr. 20, 1977

[51] Int. Cl.² .............................................. G11C 7/00
[52] U.S. Cl. .................................... 365/227; 365/190
[58] Field of Search .................... 340/173 FF, 173 R; 365/154, 190, 227

[56] References Cited

U.S. PATENT DOCUMENTS 3,703,710  11/1972  Kubo et al. .................... 340/173 FF

OTHER PUBLICATIONS

Palfi, Bilevel Powered FET Memory Cell, IBM Technical Disclosure Bulletin, vol. 14, No. 1, 6/71, pp. 261-262.
Gladu et al., Multigated "Dribble" Powered MOS FET Storage Cell, IBM Technical Disclosure Bulletin, vol. 17, No. 11, 4/75 p. 3336.
Wiedmann, Memory Cell with Low-Standby Power, IBM Technical Disclosure Bulletin, vol. 14, No. 6, 11/71, p. 1720.

Primary Examiner—Stuart N. Hecker
Attorney, Agent, or Firm—Harry M. Weiss

[57] ABSTRACT

This disclosure relates to an MOS or FET memory array that uses a single voltage source (i.e., 5 volts) and operates basically as a static memory array rather than as a dynamic memory array that requires the gates of the MOS devices of the memory array to be periodically refreshed to restore or refresh the memory states contained therein. Each of the memory cells of the memory array contains four MOS devices that are cross-coupled into a flip-flop type of memory cell. All of the memory cells connected to a common word line are also connected to a common return line to which is connected a single resistor and a single large MOS or FET device. The large MOS device is turned on during the active operation of the memory array (during write and read operations) and is turned off during the standby operation of the memory array. The resistor functions to insure that some current flow takes place, during the standby operation, from all the memory cells connected to the common return line in order to maintain the data states ("1" or "0") in each of the memory cells.

3 Claims, 1 Drawing Figure

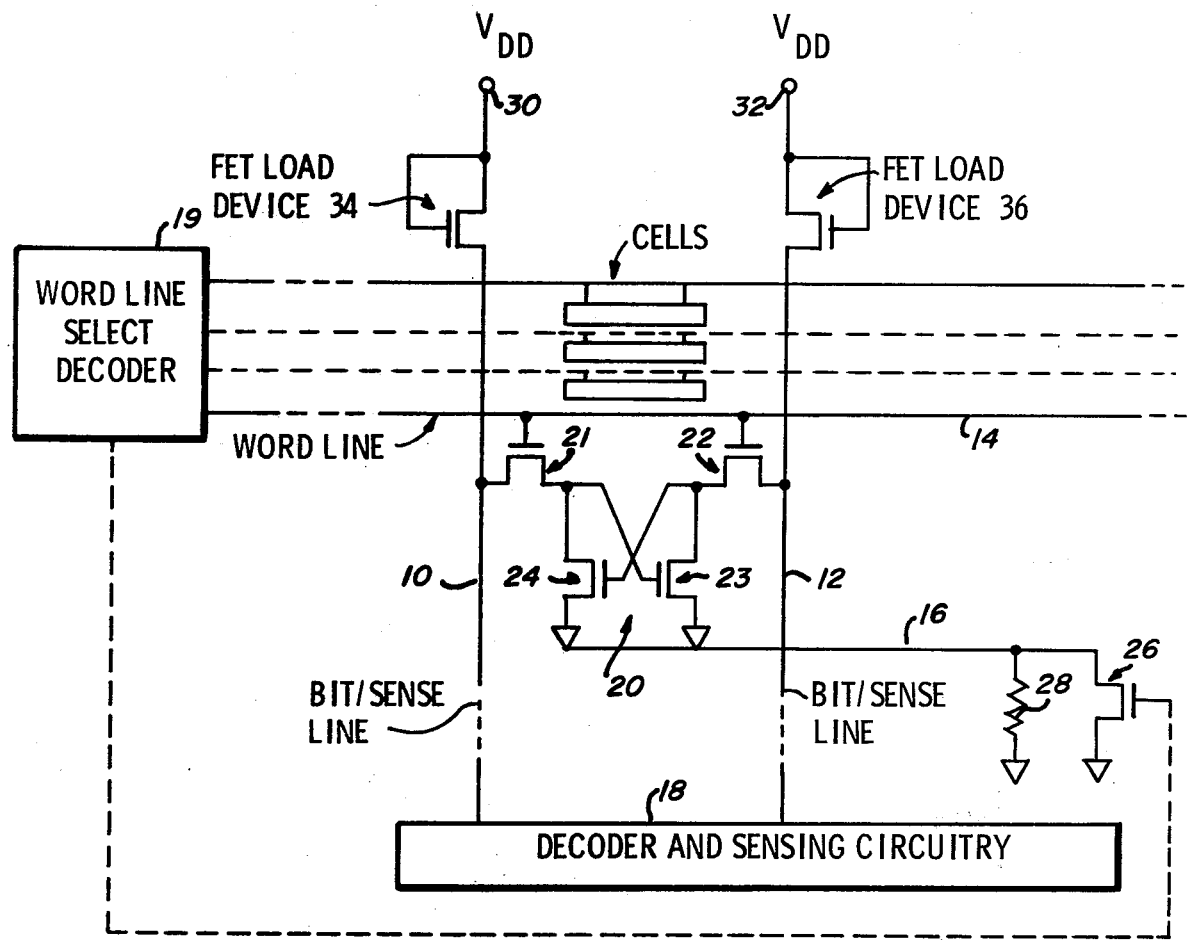

QUASI-STATIC MOS MEMORY ARRAY WITH STANDBY OPERATION

BACKGROUND OF THE INVENTION

1. Field of the Invention

This invention relates generally to MOS memory arrays and, more particularly, to static MOS memory arrays that utilize memory cells having four MOS devices per memory cell.

2. Description of the Prior Art

MOS memory arrays fall into two broad general categories, either dynamic or static. Dynamic MOS memory arrays require that the gates of the MOS or FET devices that make up the memory cells be periodically refreshed in order to prevent the data stored in the memory cells from being lost due to current leakage. Dynamic MOS memory cells have become very popular for use in large main frame memory systems that are connected up to a central processing unit to provide a computer system. The cost of dynamic memory cells has reduced very dramatically in recent years corresponding to the reduction in the number of MOS devices that were used to make up a memory cell. The number of MOS devices used to make up a dynamic memory cell have dropped from older memory cell designs that utilized four MOS devices to more recent memory cell designs that utilized three MOS devices to current memory cell designs that utilize only a single MOS device and a connected semiconductor capacitor device. As a result of this significant reduction in memory cell size with its correspondingly higher yields and lower costs, semiconductor MOS dynamic memory chips are today being manufactured as 4K bit chips and 16K bit chips with memory designers already planning 64K bit chips.

Static MOS memory cells are also very important to the semiconductor memory business and are used in memory arrays for systems that are not designed to permit refresh operations to be performed because of interference with the system's architecture. Furthermore, static MOS memory cells are less volatile than dynamic memory cells.

Static MOS memory cell designs have generally not undergone as rapid a change as dynamic memory cell designs. One of the early static MOS memory cell designs utilized six MOS devices connected up in a fairly elaborate circuit configuration which utilized a cross-coupled, flip-flop type of design. A later example of one of these types of six device, static, MOS memory cells is disclosed, for example, in U.S. Pat. No. 3,539,839. This patent shows a static memory cell design that utilizes four MOS devices and two resistors (instead of two MOS devices) in its six device static memory cell. The purpose and function of the two resistors (or two MOS devices) is to act as load devices and to hold the charges or stored memory state in the cross-coupled MOS or FET devices. The function of the other two MOS devices 32 and 33 of this prior art patent is for reading and writing operations.

A later static MOS memory cell design was developed which reduced the size of the six device static MOS memory cell to a four MOS device memory cell. An example of this type of four MOS device static memory cell is shown, for example, in U.S. Pat. No. 3,530,443. However, this type of memory cell required the use of three different potential sources (0, −8, and −16 volts) in order to operate the memory cell thus requiring two separate power supplies (−8 and −16 volts).

Accordingly, a need existed to provide a four device static MOS memory cell design and static MOS memory array configuration that would use only a single (5 volt) power supply to operate the memory cells of the memory array in both the standby and active conditions.

BRIEF DESCRIPTION OF THE DRAWING

The sole FIGURE is a schematic diagram (partially in block diagram form) of an MOS static memory array utilizing memory cells (only one of which is shown) having four MOS devices in each memory cell with each memory cell connected between two Bit/Sense lines and between a Word line and a common return line.

SUMMARY OF THE INVENTION

In accordance with one embodiment of this invention, it is an object of this invention to provide an improved MOS static memory array.

It is another object of this invention to provide an improved MOS static memory array which utilizes memory cells having four MOS devices.

It is still another object of this invention to provide an improved MOS static memory array which utilizes a single power supply.

It is a further object of this invention to provide an improved MOS static memory array which utilizes memory cells having four MOS devices operated in standby and active modes of operation with a single power supply.

DESCRIPTION OF THE PREFERRED EMBODIMENT

In accordance with one embodiment of the invention, an MOS static memory array is disclosed which comprises a plurality of MOS memory cells. The MOS static memory array also comprises means for writing information into the MOS memory cells, means for reading information contained in the MOS memory cells and constant energy source means for maintaining the information state of the MOS memory cells during the period of time when there is no reading or writing operation being performed with the MOS memory cells. Also included in the MOS static memory array is a plurality of Bit/Sense lines connected to the MOS memory cells, a plurality of Word lines also connected to the MOS memory cells, and a plurality of common return lines connected to the MOS memory cells. Each of the common return lines has a current sinking means for permitting current sinking into the current sinking means from all of the MOS memory cells connected to each of the common return lines during writing and reading operations. Each of the common return lines also has means connected thereto for permitting some current flow from each of the MOS memory cells connected to each of the common return lines during the period of time when there is no reading or writing operation being performed with the MOS memory cells of the MOS static memory array. Preferably, the current sinking means is a large MOS device and the current flow permitting means is a resistor device that is connected in parallel to the large MOS device. The memory cells are four MOS device cells.

THE SPECIFICATION

Referring generally to the sole FIGURE, an MOS static memory array is shown. While reference is made to the use of MOS devices in the memory cells of the memory array, other types of Field Effect Transistor (FET) devices can be used and hence, the use of the term MOS throughout the specification and claims is not intended to be limiting, but is for example purposes only.

MOS transistor device means a Metal-Oxide-Semiconductor transistor device which term is used to generally designate a particular class of FET device.

The structure of an MOS transistor comprises a substrate of semiconductor material (such as silicon) of one conductivity type (such as of P- type conductivity). Located within the semiconductor substrate is a pair of N+ (source and drain) regions and of opposite conductivity type, each forming a respective PN junction with the semiconductor substrate and each junction extends to the surface of the substrate. One N+ region is spaced apart from the other N+ region thereby creating a channel region therebetween. A protective layer of dielectric material (such as silicon dioxide) overlies the substrate surface channel region and has a thickness of approximately 1,000 angstroms. Ohmic contact is made to the two N+ regions by the use of metal electrodes. The electrodes typically comprise a suitable metal, such as aluminum, although a conductive semiconductor material, such as silicon with appropriate impurities deposited therein to increase conductivity, can also be used. Located atop the protective insulating layer is a third electrode, which functions as a gate to control conduction across the channel region. Typically, the gate electrode comprises a suitable metal, such as aluminum, although a conductive semiconductive material, such as silicon with appropriate impurities deposited therein, can be used.

The structure described above is that of an N channel MOS device capable of operation in the normally off, or enhancement, mode; that is, conduction normally does not occur in the channel region between the drain and source.

Referring more specifically to the sole FIGURE, a Bit/Sense line 10 and a Bit/Sense line 12 are selected as examples of two Bit/Sense lines of a multiplicity of Bit/Sense lines for the MOS memory array shown in the sole FIGURE. Similarly, Word line 14 is selected as an example of one Word line of a multiplicity of Word lines in the MOS memory array illustrated in the sole FIGURE. A common return line 16 is used with the Word line 14 of the MOS memory array and is connected to all of the memory cells that are tied between the Word line 14 and the common return line 16. Similarly, separate common return lines (not shown) are connected to memory cells that are also hooked onto other corresponding separate Word lines (not shown).

A first decoder 18, which also functions as a sense amplifier, is connected to the Bit/Sense lines of the MOS static memory array of the sole FIGURE. This is a conventional decoder used to select pairs of Bit/Sense lines and also functions to differentially sense the voltages on the selected Bit/Sense lines during a Read Operation as is described below. A second decoder 19 is connected to the Word lines and functions to select a particular Word line during the active operation of the MOS static memory array. The second decoder 19 also functions to supply +5 volts to the selected Word line during the active operation of the MOS static memory array and to all the Word lines during the standby operation of the MOS static memory array.

One memory cell generally designated by reference numeral 20 is shown connected between the Bit/Sense lines 10 and 12 and between the Word line 14 and the common return line 16. Since there are many other Bit/Sense lines (not shown) and many Word and common return (one for each Word line) lines (not shown) in the MOS memory array of the sole FIGURE, a number of memory cells (also not shown) would be used connected up in the same manner as the memory cell 20 is to its Bit/Sense lines 10 and 12 and its Word line 14 and common return line 16. Static MOS memory arrays being produced today have over one thousand memory cells per memory array.

The MOS memory cell 20 has an MOS device 21 that has its gate electrode connected to the Word line 14 and its drain region connected to the Bit/Sense line 10. The MOS memory cell 20 also has an MOS device 22 which has its gate electrode connected to the Word line 14 and its drain region connected to the Bit/Sense line 12

The MOS memory cell 20 also has an MOS device 23 and an MOS device 24 connected up in a cross-coupled or flip-flop arrangement as shown. Accordingly, the drain region of the MOS device 23 is connected to both the source region of the MOS device 22 and the gate electrode of the MOS device 24. Similarly, the drain region of the MOS device 24 is connected to both the source region of the MOS device 21 and the gate electrode of the MOS device 23. The source regions of both of the MOS devices 23 and 24 are connected to the common return line 16.

The common return line 16 is connected to the other memory cells that are connected to the Word line 14. Attached to the common return line 16 at the end thereof is a large MOS device 26. Also attached to the common return line 16 and connected up in parallel to the large MOS device 26 is a resistor 28. The resistor 28 is a resistor that is carefully sized so that the voltage drop from the Word line 14 and the common return line 16 is at least equal to the largest sum of the threshold voltages of one memory cell connected to the common return line 16 having the MOS devices 21, 24 or 22, 23 in series for all the memory cells connected to the common return line 16 plus a small increment or delta value to insure that some current will always flow, during standby operation, in all the memory cells connected to the common return line 16. The large MOS device 26 is sized to serve as a current sink to permit current sinking to take place into the large MOS device 26 from all of the memory cells connected to the same Word line 14 and the same common return line 16 during the read or write operation.

A pair of $V_{DD}$ terminals 30 and 32 are connected to Bit/Sense lines 10 and 12, respectively, and serve to connect the voltage supply (not shown) to the Bit/Sense lines 10 and/or 12 during active and standby operations. A conventional MOS load device 34 is connected to the Bit/Sense line 10 near the $V_{DD}$ terminal 32. Both MOS load devices 34 and 36 have their gate electrodes connected to their drain regions.

The large MOS device 26, which is only operated during the Active (read or write) operation is turned on, preferably, by connection to the Word line select decoder when the corresponding Word line is turned on. During standby operation, the Word lines are all turned on and all the large MOS devices for all the common return lines are all turned off.

The operation of the MOS static memory array of the sole FIGURE in its active (read and write) state and its standby state is described below.

WRITE OPERATION

In carrying out a write operation into the memory cell, the decoder 18 that is connected to the Bit/Sense lines selects Bit/Sense lines 10 and 12. A differential voltage of about +5 volts is applied to Bit/Sense line 10 by means of $V_{DD}$ terminal 30 and 0 volts or ground is applied to Bit/Sense line 12 by means of $V_{DD}$ terminal 32 to write a Logic "1". By reversing the voltages to the Bit/Sense lines 10 and 12, a Logic "0" is written.

The Word line decoder functions to select the Word line 14 and +5 volts is applied to the selected Word line. Thus, in writing into this static type memory cell 20, only a single 5 volt power supply is needed.

The MOS or FET devices 21 and 22 are both turned on and become conducting because of the 5 volts applied to the gates of these two MOS devices by means of the 5 volts applied to the selected Word line 14 that is connected to the gates of the two MOS devices. Since there is a 5 volt potential applied to the drain region of the MOS device 21 in writing a Logic "1", the gate of the MOS device 24 gets charged up to a potential of about +4 volts because it is electrically connected to the source region of the MOS device 21. One volt is generally lost through the MOS device 21.

Although the MOS device 22 is turned on because of the 5 volt potential applied to its gate electrode, the drain region of this MOS device 22 is electrically connected to the Bit/Sense line 12 which is at 0 volts and thus, the drain and source regions of the MOS device 22 are both at ground potential (0 volts). Accordingly, the gate of the MOS device 23 is also at 0 volts since it is connected to the source region of the MOS device 22 and, therefore, the MOS device 23 is not turned on.

Since the MOS device 24 now has 4 volts on its gate electrode and 0 volts on its drain electrode because it is connected to the source region of the MOS device 22 which is at 0 volts as described above, the MOS device 24 is turned on and current goes through the MOS device 24 to ground. Thus, this serves to reinforce the discharge of current away from the drain electrode of the MOS device 24.

Now, the 5 volt potential applied to the selected Word line 14 is removed and the static memory cell 20 of this invention is in a pseudo static state with the gate of the MOS device 24 being at about 4 volts and the gate of MOS device 23 being at about 0 volts. This condition or state of the memory cell 20 designates that a logic "1" has been written into the memory cell 20. In order to write a Logic "0" into the memory cell 20 0 volts is applied to the Bit/Sense line 10 by means of $V_{DD}$ terminal 30 and 5 volts is applied to the Bit/Sense line 12, by means of $V_{DD}$ terminal 32, which is the reverse of what was described above for writing a Logic "1" into the memory cell 20. Therefore, in writing a "0" into the memory cell 20, a voltage of about 4 volts is on the gate of the MOS device 23 and 0 volts is on the gate of the MOS device 24.

READ OPERATION

In reading, both Bit/Sense lines 10 and 12 are sensed by means of the Sense Amplifiers 18 located at the end of the Bit/Sense lines 10 and 12. Each Bit/Sense line 10 and 12 has its respective load MOS device 34, 36 always turned on because of the +5 volt potential applied to the $V_{DD}$ terminal 30, 32 that is connected to each load MOS device. Each load MOS device 34, 36 has its gate electrode connected to the drain region as shown. Thus, a voltage of about +5 volts is set on the two Bit/Sense lines 10 and 12. Prior to reading out the information contained in the memory cell 20 associated with the two Bit/Sense lines 10 and 12 there is no potential applied to the opposite ends of the two Bit/Sense lines 10 and 12 (opposite the $V_{DD}$ terminals).

Now, for reading, a +5 volt potential is applied to the selected Word line 14 to determine the information state (either a Logic "1" or a Logic "0") contained in the memory cell associated with the two Bit/Sense lines 10 and 12, the Word line 14 and the common return line 16. The MOS devices 21 and 22 are not turned on due to the +5 volts applied to the gates of the MOS devices 21 and 22 by means of the Word line 14 being connected to the gates of the MOS devices 21 and 22. The MOS devices 23 and 24 are designed to override the current coming from the Bit/Sense line MOS load devices 34, 36 which are still turned on because of the +5 volt potential applied thereto at the $V_{DD}$ terminals 30, 32. Thus, the MOS device 23 is still turned off and the MOS device 24 is still turned on from the prior write "1" operation.

In sensing or reading a Logic "1" that was earlier written into the memory cell 20 associated with the Word line 14 and the Bit/Sense lines 10 and 12, the MOS device 23 was turned off and is still non-conducting because its gate electrode had 0 volts applied thereto during the prior write operation whereas the MOS device 24 was turned on and is conducting because its gate electrode has 4 volts applied thereto during the same prior write operation. Since the MOS device 24 was turned on during the prior write operation, then the +5 volts applied to the Bit/Sense line 12 discharges down to 0 volts because of the current path running through the turned on Mos devices 22 and 24 into the ground return line. However, current cannot flow through the MOS device 23 since it is still turned off and hence, the +5 volts applied to the Bit/Sense line 10 cannot be reduced because there is no current discharge path through MOS devices 21 and 23 as there was for the Bit/Sense line 12 because of the turned on MOS devices 22 and 24.

Accordingly, since the Bit/Sense line 10 is at +5 volts and the Bit/Sense line 12 is at 0 volts, the Sense Amplifiers 18 located at the end of the Bit/Sense lines 10 and 12 can sense the difference or differential voltages from the two Bit/Sense lines 10 and 12 which would indicate that a Logic "1" was written into the memory cell because of the higher voltage on the Bit/Sense line 10. Correspondingly, a Logic "0" could be sensed when the higher voltage (+50 volts) is on the Bit/Sense line 12 with the Bit/Sense line 10 being at 0 volts because of the fact that the MOS device 23 was turned on during the write "0" operation and the MOS device 24 was turned off (which is the reverse situation as compared to the write "1" operation).

STANDBY OPERATION

The function and operation of the resistor 28 and the large MOS device 26 that are connected to the common return line 16 that is connected to the node points A and B associated with MOS or FET devices 23 and 24 is important for both the Active operation (during a Read or Write operation) and the Standby operation (during the period of time when there is no Read or Write operation being performed).

During the Active operation, +5 volts ($V_{DD}$) is applied to the gate of the large MOS device 26 to turn on the large MOS device 26. The effect of turning on this large MOS device 26 is to have the large MOS device 26 effectively function to permit current sinking to take place into the large MOS device 26 from all of the memory cells connected to the same Word line 14 and the same common return line 16. Thus, current flows from the memory cells connected to the same return line through the large MOS device 26 to ground during the Active operation. Accordingly, the nodes A and B are effectively at ground because of the current sinking into the large MOS device.

During the Standby operation, the +5 volt ($V_{DD}$) potential source is removed from the gate of the large MOS device 26 thereby turning this large MOS device 26 off because 0 volts is applied to the gate thereof. When the large MOS device 26 is turned off during the Standby operation, the resistor 28 (which is sized to limit current coming down the return line from the MOS memory cells because some current is always coming from the memory cells connected to the common return line) functions to insure that some current flow takes place from all the memory cells connected to the common return line 16 in order to maintain the data states ("1" or "0") in each of the memory cells. During Standby operation, all the Bit/Sense lines and all the Word lines of the memory array are connected to a +5 volt potential to maintain the memory states ("1" or "0") in each of the memory cells.

While the invention has been particularly shown and described with reference to the preferred embodiment described above, it will be understood by those skilled in the art that the foregoing and other changes in the form and details may be made therein without departing from the spirit and scope of the invention.

What is claimed is:

1. An MOS static memory array comprising, in combination, a plurality of MOS memory cells, means for writing information into said MOS memory cells, means for reading information contained in said MOS memory cells, and constant energy source means for maintaining the information state of said MOS memory cells during the period of time when there is no reading or writing operation being performed with said MOS memory cells, a plurality of Bit/Sense lines connected to said MOS memory cells, a plurality of Word line select decoder lines connected to said MOS memory cells, and a plurality of common return lines connected to said MOS memory cells, each of said common return lines having current sinking means for permitting current sinking into said current sinking means from all of said MOS memory cells connected to each of said common return lines during writing and reading operations, and means connected to each of said common return lines for permitting some current flow from each of said MOS memory cells connected to each of said common return lines to pass through said common return lines during the period of time when there is no reading or writing operation being performed with said MOS memory cells, said current sinking means comprising an MOS device, said current flow permitting means comprising only one resistor device, said resistor device being connected in parallel to said MOS device, each of said memory cells comprising four MOS devices, each of said four MOS devices having a gate electrode, a drain region and a source region, one of said four MOS devices having its gate electrode connected to one of said plurality of Word lines and its drain region connected to one of a pair of Bit/Sense lines, a second of said four MOS devices having its gate electrode connected to the same one of said plurality of Word line select decoder lines and its drain region connected to the second of said pair of Bit/Sense lines, a third and fourth of said four MOS devices connected up in a cross-coupled arrangement having the drain region of the third of said four MOS devices connected to the source region of said second of said four MOS devices and to the gate electrode of the fourth of said four MOS devices, the drain region of the fourth of said four MOS devices is connected to the source region of said one of said four MOS devices and to the gate electrode of the third of said four MOS devices, the source regions of both the third and fourth of said four MOS devices being connected to one of said plurality of common return lines that is associated with said one of said plurality of Word lines said memory array being adapted to operate at all times with a single power supply, said memory array being adapted to operate at all times with a +5 volt single power supply.

2. An MOS static memory array in accordance with Claim 1 including an MOS load device connected to each of said pair of Bit/Sense lines, each said MOS load device having a gate electrode, a source region and a drain region.

3. An MOS static memory array in accordance with claim 2 wherein said gate electrode of each said MOS load device being connected to said drain region of said MOS load device.

* * * * *